United States Patent
Liu et al.

(10) Patent No.: US 12,075,668 B2
(45) Date of Patent: Aug. 27, 2024

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Qi Liu, Beijing (CN); Cong Fan, Beijing (CN); Xiangdan Dong, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 627 days.

(21) Appl. No.: 17/425,113

(22) PCT Filed: Feb. 25, 2020

(86) PCT No.: PCT/CN2020/076564
§ 371 (c)(1),
(2) Date: Jul. 22, 2021

(87) PCT Pub. No.: WO2021/168646
PCT Pub. Date: Sep. 2, 2021

(65) Prior Publication Data
US 2022/0320237 A1    Oct. 6, 2022

(51) Int. Cl.
*H10K 59/131*    (2023.01)
*G06F 3/041*    (2006.01)
(Continued)

(52) U.S. Cl.
CPC ......... *H10K 59/131* (2023.02); *G06F 3/0412* (2013.01); *G06F 3/04164* (2019.05);
(Continued)

(58) Field of Classification Search
CPC ..... G06F 3/0412; G06F 3/0416–04186; G06F 3/044–0448; G09G 3/32–3291; G09G 2300/0426; G09G 2300/0452
See application file for complete search history.

(56) References Cited

U.S. PATENT DOCUMENTS 9,478,586 B2 * 10/2016 Lee .................. H10K 59/123
10,224,386 B2 * 3/2019 Rieutort-Louis .... H10K 50/813
(Continued)

FOREIGN PATENT DOCUMENTS

CN    106168865 A    11/2016
CN    106775063 A    5/2017
(Continued)

OTHER PUBLICATIONS

International Search Report in PCT/CN2020/076564 dated Nov. 26, 2020 with English translation.
(Continued)

*Primary Examiner* — Patrick F Marinelli
(74) *Attorney, Agent, or Firm* — Collard & Roe, P.C.

(57) ABSTRACT

A display substrate and a display device. The display substrate includes a base substrate, a first metal signal layer and a metal touch layer. The first metal signal line layer includes a plurality of first metal signal lines extending along a first direction, a plurality of metal connection signal lines are included between every two adjacent first metal signal lines. The metal touch layer is includes a plurality of grid lines which are intersected. At least one part of each of the plurality of metal connection signal lines is parallel to the plurality of grid lines of the metal touch layer, and in a direction perpendicular to the base substrate, the part of each of the plurality of metal connection signal lines parallel to (Continued)

the plurality of grid lines of the metal touch layer is overlapped with the plurality of grid lines of the metal touch layer.

17 Claims, 5 Drawing Sheets

(51) Int. Cl.
  *G06F 3/044* (2006.01)
  *G09G 3/3233* (2016.01)
  *H10K 59/40* (2023.01)
(52) U.S. Cl.
  CPC ......... *G06F 3/0446* (2019.05); *G09G 3/3233* (2013.01); *G06F 2203/04111* (2013.01); *G06F 2203/04112* (2013.01); *G09G 2300/0426* (2013.01); *G09G 2354/00* (2013.01); *H10K 59/40* (2023.02)

(56) References Cited

U.S. PATENT DOCUMENTS

| | | | |
|---|---|---|---|
| 10,496,202 B2 | 12/2019 | Zhan et al. | |
| 10,700,151 B2 * | 6/2020 | Rieutort-Louis | H10K 59/353 |
| 10,705,668 B2 | 7/2020 | Li | |
| 10,866,664 B2 * | 12/2020 | Miyamoto | G06F 3/0443 |
| 11,023,058 B2 * | 6/2021 | Park | G06F 3/0446 |
| 11,093,092 B2 | 8/2021 | Zeng et al. | |
| 11,257,883 B2 * | 2/2022 | Lin | H10K 50/824 |
| 11,410,451 B2 | 8/2022 | Uehara et al. | |
| 11,600,669 B2 * | 3/2023 | Na | G06F 3/0446 |
| 11,640,219 B2 * | 5/2023 | Zhong | G06F 3/0448 |
| | | | 345/174 |
| 11,782,542 B2 * | 10/2023 | Miyamoto | G09G 3/3225 |
| | | | 345/173 |
| 2012/0257135 A1 | 10/2012 | Chen et al. | |
| 2014/0022148 A1 | 1/2014 | Kim et al. | |
| 2015/0346866 A1 * | 12/2015 | Kusunoki | G06F 3/0488 |
| | | | 345/174 |
| 2016/0299612 A1 | 10/2016 | Lu et al. | |
| 2018/0032189 A1 | 2/2018 | Lee et al. | |
| 2018/0090553 A1 * | 3/2018 | Rieutort-Louis | H10K 59/1213 |
| 2018/0129352 A1 | 5/2018 | Kim et al. | |
| 2019/0064980 A1 * | 2/2019 | Oh | G06F 3/0445 |
| 2019/0138128 A1 * | 5/2019 | Hwang | G06F 3/0448 |
| 2019/0302959 A1 | 10/2019 | Clark et al. | |
| 2020/0194525 A1 * | 6/2020 | Lin | G09G 3/3233 |
| 2021/0026483 A1 * | 1/2021 | Miyamoto | G06F 3/0412 |
| 2022/0320237 A1 * | 10/2022 | Liu | G02F 1/1333 |

FOREIGN PATENT DOCUMENTS

| | | |
|---|---|---|
| CN | 206479736 U | 9/2017 |
| CN | 108319398 A | 7/2018 |
| CN | 208903230 U | 5/2019 |
| CN | 110188702 A | 8/2019 |
| JP | 2018005291 A | 1/2018 |
| JP | 2019526896 A | 9/2019 |

OTHER PUBLICATIONS

Written Opinion in PCT/CN2020/076564 dated Nov. 26, 2020 with English translation.
Extended European Search Report in European Application No. 20921378.4 dated Mar. 2, 2023.
Japanese Office Action in Japanese Application No. 2021-573139 dated Oct. 31, 2023 with English translation.
Japanese Office Action in Japanese Application No. 2021-573139 dated Mar. 19, 2024 with English translation.

* cited by examiner

DISPLAY SUBSTRATE AND DISPLAY DEVICE

CROSS REFERENCE TO RELATED APPLICATIONS

This application is the National Stage of PCT/CN2020/076564 filed on Feb. 25, 2020, the disclosure of which is incorporated by reference.

TECHNICAL FIELD

Embodiments of the present disclosure relate to a display substrate and a display device.

BACKGROUND

The organic light emitting diode (OLED) display panel has been widely used in various electronic products because of the advantages of light weight, self-luminescence, wide viewing angle, low driving voltage, high luminous efficiency, low power consumption and fast response speed, etc. At present, fingerprint detection has become an important verification method for electronic products, and especially, the under-screen fingerprint detection technology is beneficial to realize the narrow frame design of the display panel. Nowadays, more and more under-screen fingerprint detection solutions for electronic products, mainly including optical, ultrasonic and capacitive under-screen fingerprint detection, have been proposed in the industry, and the optical under-screen fingerprint detection technology is most widely used. Optical under-screen fingerprint detection technology relies on light reflection to detect fingerprint loop, and compares the obtained fingerprint image with the image in database, so as to achieve the purpose of fingerprint detection. Optical under-screen fingerprint detection technology is widely used in the OLED display panel.

SUMMARY

Embodiments of the present disclosure provide a display substrate and a display device. In the display substrate, at least one part of each of the plurality of metal connection signal lines is parallel to and overlapped with the grid lines of the metal touch layer, which can reduce the shielding area of the first metal signal line layer and the metal touch layer on the display substrate, thereby improving the under-screen fingerprint detection sensitivity of the display device adopting the display substrate.

One embodiment of the present disclosure provides a display substrate, including: a base substrate; a first metal signal line layer, located on the base substrate and including a plurality of first metal signal lines extending along a first direction, a plurality of metal connection signal lines being included between every two adjacent first metal signal lines, and the plurality of metal connection signal lines connecting the two adjacent first metal signal lines; a metal touch layer, located at one side of the first metal signal line layer away from the base substrate and including a plurality of grid lines which are intersected, the plurality of grid lines forming a plurality of grids arranged in an array, wherein at least one part of each of the plurality of metal connection signal lines is parallel to the plurality of grid lines of the metal touch layer, and in a direction perpendicular to the base substrate, the part of each of the plurality of metal connection signal lines parallel to the plurality of grid lines of the metal touch layer is at least partially overlapped with the plurality of grid lines of the metal touch layer.

In some examples, each of the plurality of metal connection signal lines is a fold line including a first metal connection line segment and a second metal connection line segment connected with each other.

In some examples, the first metal connection line segment extends along a second direction which is perpendicular to the first direction, and the second metal connection line segment extends along a direction which forms an acute angle or obtuse angle with the first direction.

In some examples, the second metal connection line segment is parallel to the grid lines of the metal touch layer, and in the direction perpendicular to the base substrate, the second metal connection line segment is overlapped with the grid lines of the metal touch layer.

In some examples, in the direction perpendicular to the base substrate, an overlapping area between the second metal connection line segment and the grid lines is greater than 50% of an area of the metal connection signal line.

In some examples, in the direction perpendicular to the base substrate, the first metal connection line segments of a part of the metal connection signal lines are at least partially overlapped with a part of the grid lines located at corners of the grids.

In some examples, in one of the metal connection signal lines, an overlapping area between the first metal connection line segment and the grid line located at the corner of the grid is smaller than an overlapping area between the second metal connection line segment and the grid line of the metal touch layer.

In some examples, the grid lines include a plurality of breakpoints, and in the direction perpendicular to the base substrate, the second metal connection line segments are overlapped with at least part of the breakpoints.

In some examples, a length of the second metal connection line segment is greater than a length of the first metal connection line segment.

In some examples, the display substrate further includes a plurality of light emitting elements arranged in an array, a light transmission gap being included between adjacent light emitting elements, and in the direction perpendicular to the base substrate, the plurality of light emitting elements are located between the metal touch layer and the first metal signal line layer, wherein the plurality of grids are in one-to-one correspondence with the plurality of light emitting elements, an orthographic projection of each light emitting element on the base substrate falls within an orthographic projection of a corresponding grid on the base substrate, and an area of the orthographic projection of each light emitting element on the base substrate is smaller than an area of the orthographic projection of the corresponding grid on the base substrate.

In some examples, the plurality of light emitting elements include a red light emitting element, a green light emitting element and a blue light emitting element, and in the direction perpendicular to the base substrate, a middle part of the first metal connection line segment corresponding to the green light emitting element is not overlapped with the grid line, and two ends of the first metal connection line segment corresponding to the green light emitting element is overlapped with the grid line; the first metal connection line segment corresponding to the red light emitting element is completely overlapped with the grid line; a middle part of the first metal connection line segment corresponding to the blue light emitting element is not overlapped with the grid line, and two ends of the first metal connection line segment corresponding to the blue light emitting element is overlapped with the grid line.

In some examples, the display substrate further includes a second metal signal line layer, located at one side of the first metal signal line layer close to the base substrate, wherein the second metal signal line layer includes a plurality of second metal signal lines extending along the first direction, and the plurality of second metal signal lines are electrically connected with the plurality of first metal signal lines.

In some examples, in the direction perpendicular to the base substrate, the plurality of metal connection signal lines are not overlapped with the plurality of light emitting elements.

In some examples, the display substrate further includes a pixel defining layer, including a plurality of openings arranged in an array, wherein the plurality of openings are in one-to-one correspondence with the plurality of light emitting elements, and the plurality of openings of the pixel defining layer define effective light emitting regions of the plurality of light emitting elements.

In some examples, the display substrate further includes an encapsulation layer, covering the light emitting element, wherein the metal touch layer is located at one side of the encapsulation layer away from the base substrate.

In some examples, the display substrate further includes a data line, located in a same layer as the second metal signal line layer, parallel to and insulated from the plurality of second metal signal lines.

In some examples, the metal touch layer includes a touch electrode bridging layer, an insulating layer and a touch electrode layer which are laminated, the insulating layer is located between the touch electrode bridging layer and the touch electrode layer, and the insulating layer includes a via hole connecting the touch electrode bridging layer and the touch electrode layer.

In some examples, the plurality of first metal signal lines are power lines.

In some examples, the display substrate further includes a thin film transistor and a connection electrode, located between the base substrate and the light emitting element, the thin film transistor includes an active layer on the base substrate, a gate electrode located at one side of the active layer away from the base substrate, and a source electrode and a drain electrode located at one side of the gate electrode away from the base substrate; the connection electrode is located between the thin film transistor and the light emitting element, and is electrically connected with the drain electrode of the thin film transistor and the light emitting element; the first metal signal line layer and the connection electrode are arranged in a same layer, and the second metal signal line layer and the source electrode are arranged in a same layer.

In some examples, the base substrate is a flexible base substrate.

One embodiment of the present disclosure further provides a display device, including the display substrate according to any one of the above examples.

In some examples, the display device further includes a fingerprint sensor, located at one side of the base substrate away from the first metal signal line layer and configured to detect a fingerprint on the display substrate.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Upper", "lower", "left", "right", etc. are only used to indicate the relative positional relationship, and when the absolute position of the object to be described is changed, the relative positional relationship may also change accordingly.

Under-screen fingerprint detection solutions usually use the light, which is used for display, of the display panel itself as a light source, and the fingerprint sensor is usually arranged at a non-display side of the display panel or integrated in the functional layer of the display panel, thus realizing the under-screen fingerprint detection function. OLED has the characteristics of self-luminescence, and luminescence thereof can be controlled or modulated as needed, which can provide convenience for fingerprint image acquisition and help to improve the integration of electronic devices. At present, the optical under-screen fingerprint detection solution is widely used in the OLED display panel to realize unlocking or other functions.

Figure 1:
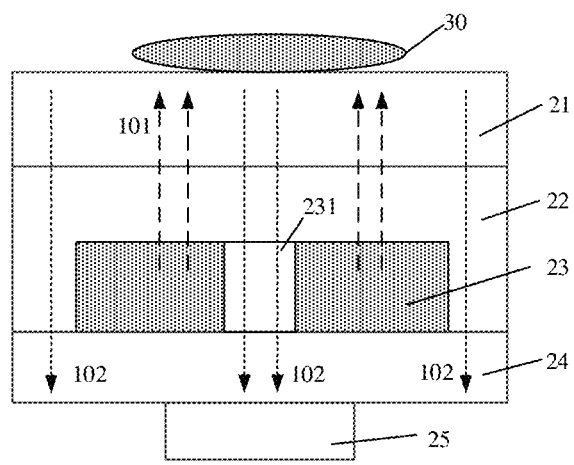
FIG. 1 is a schematic diagram of an OLED display panel with an under-screen fingerprint detection function.

FIG. 1 is a schematic diagram of an OLED display panel with an under-screen fingerprint detection function. As illustrated in FIG. 1, the OLED display panel includes a top film 21, a thin film encapsulation layer 22, a pixel unit array 23 and a base substrate 24.

The base substrate 24 provides protection and support functions for other structures and functional layers located thereon, and it is, for example, a plastic substrate or a glass substrate.

The pixel unit array 23 is formed on the base substrate 24 and includes a plurality of pixel units arranged in a predetermined array. The light 101 emitted from the pixel units is used for display and used as light for under-screen fingerprint detection.

The thin film encapsulation layer 22 covers the pixel unit array 23 to prevent external water vapor from entering into the pixel unit array 23 and causing the aging or deterioration of the pixel unit array 23, and the thin film encapsulation layer 22 can be a multi-layer thin film encapsulation layer, for example, including an inorganic encapsulation layer, an organic encapsulation layer and the like which are laminated.

A fingerprint sensor 25 used for acquiring fingerprint images is disposed (for example, attached via optical clear adhesive (OCA)) on one side of the base substrate 24 away from the pixel unit array 23 (i.e., the lower side in the figure), and is configured to detect the reflected light 102 used for fingerprint detection which is reflected from the fingerprint 30 on the surface of the top film 21. The fingerprint sensor 25 has a certain area and includes, for example, a plurality of detection units arranged in a predetermined array.

According to needs, the OLED display panel can also include other structures or functional layers. For example, the OLED display panel can include a touch structure for realizing a touch function. For example, the touch structure can be built in the pixel unit array 23, or formed on the top film 21, or formed on the thin film encapsulation layer 22, and can be capacitive or resistive, etc.

In order to realize the under-screen fingerprint detection function, the top film 21, the thin film encapsulation layer 22 and the base substrate 24 are at least partially transparent or translucent, or a light transmission gap 231 is formed between adjacent pixel units in the pixel unit array 23, so that the reflected light of the fingerprint on the surface of the top film 21 can be incident on the fingerprint sensor 25 through the transparent/translucent film layer or the light transmission gap, so as to acquire fingerprint images.

The inventors of the present application have noticed that there are a plurality of kinds of metal traces (such as a power signal line, a gate signal line, a data signal line, a metal touch layer, a touch signal line, etc.) in the OLED display substrate, and the plurality of kinds of metal traces are laminated, which will block the transparent/translucent film layer or light transmission gap 231, thus affecting the sensitivity of fingerprint detection.

In view of the above problems, the embodiments of the present disclosure provide a display substrate and a display device. The display substrate includes a base substrate, a first metal signal line layer and a metal touch layer. The first metal signal line layer is located on the base substrate and includes a plurality of first metal signal lines extending along a first direction, a plurality of metal connection signal lines are arranged between every two adjacent first metal signal lines, and the plurality of metal connection signal lines connect the two adjacent first metal signal lines. The metal touch layer is located at one side of the first metal signal line layer away from the base substrate, and includes a plurality of grid lines which are intersected, and the plurality of grid lines form a plurality of grids arranged in an array. At least one part of each of the plurality of metal connection signal lines is parallel to the plurality of grid lines of the metal touch layer, and in a direction perpendicular to the base substrate, the part of each of the plurality of metal connection signal lines parallel to the plurality of grid lines of the metal touch layer is at least partially overlapped with the plurality of grid lines of the metal touch layer. In the display substrate, the metal connection signal lines are parallel to and overlapped with the grid lines of the metal touch layer, which can reduce the shielding area of the first metal signal line layer and the metal touch layer on the transparent/translucent film layer or light transmission gap of the display substrate, thereby improving the sensitivity of under-screen fingerprint detection of a display device adopting the display substrate and realizing large-area under-screen fingerprint identification.

The display substrate and the display device provided by the embodiments of the present disclosure will be described below with reference to the accompanying drawings.

Figure 2A:
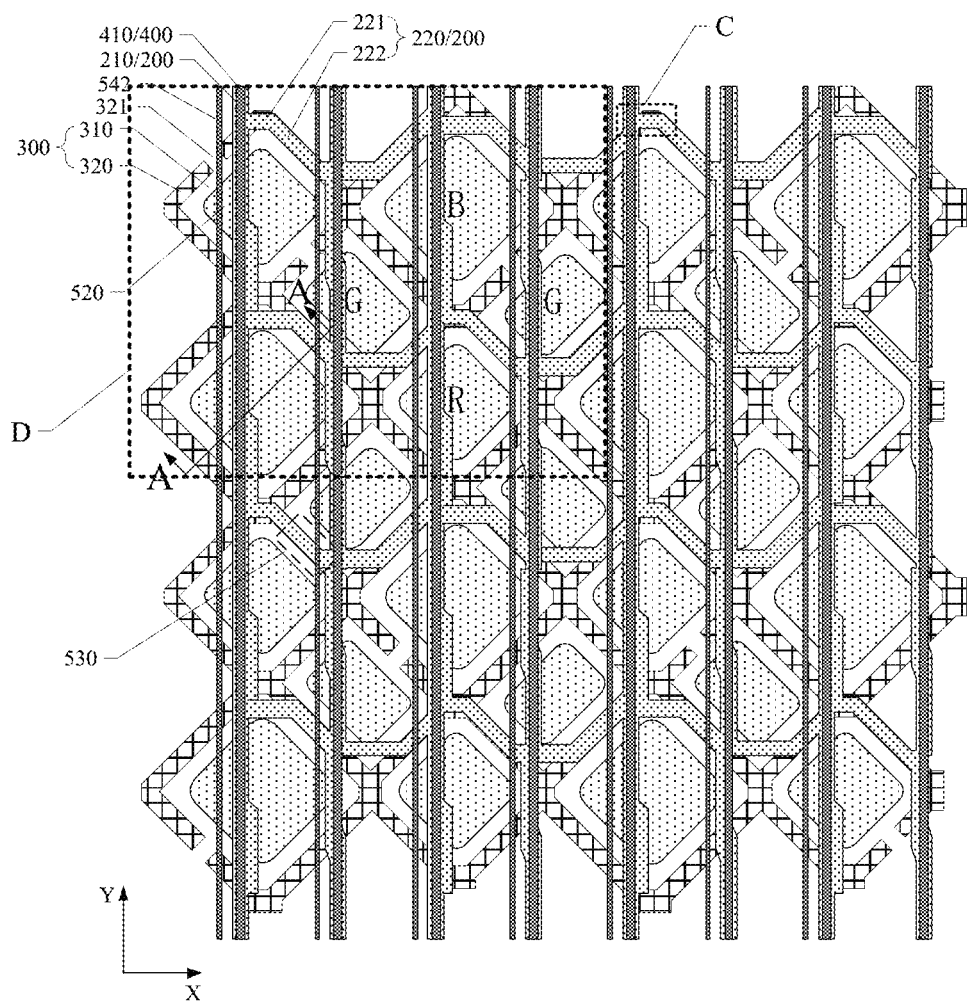
FIG. 2A is a planar structural view of a display substrate according to an embodiment of the present disclosure.
Figure 2B:
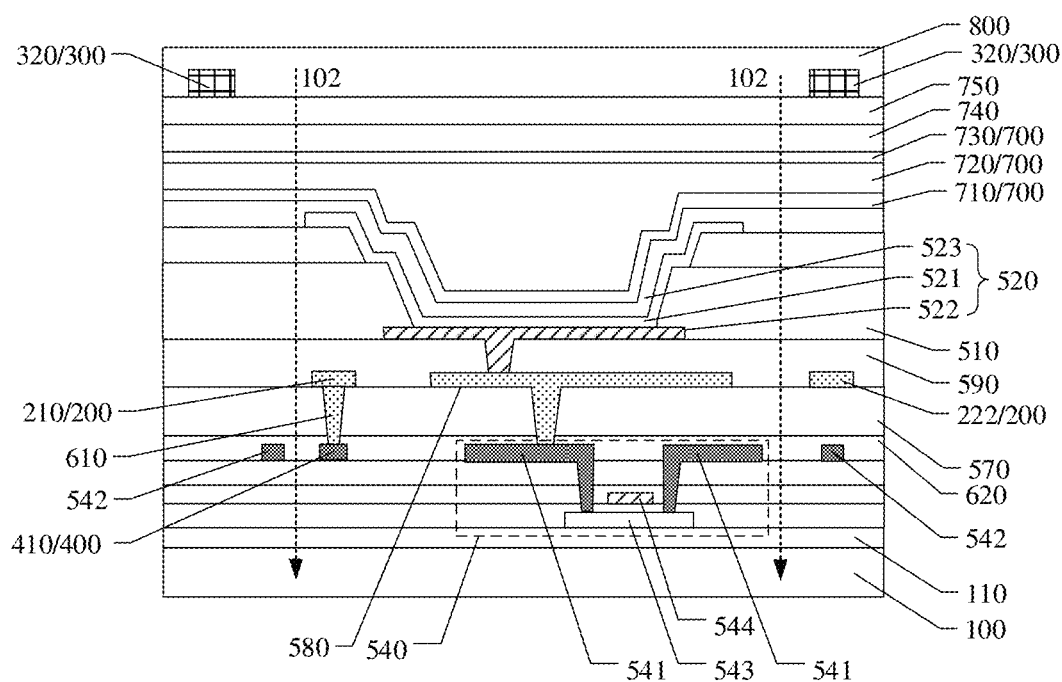
FIG. 2B is a cross-sectional structural view of the display substrate illustrated in FIG. 2A taken along line A-A.

An embodiment of the present disclosure provides a display substrate. FIG. 2A is a planar structural view of a display substrate according to an embodiment of the present disclosure, and FIG. 2B is a cross-sectional structural view of the display substrate illustrated in FIG. 2A taken along line A-A. It should be noted that in order to more clearly show the overlapping relationship between the first metal signal line layer and the metal touch layer, FIG. 2A is a planar structural view of the display substrate viewed from a non-display side to the display side, so the first metal signal line layer is located above the metal touch layer in FIG. 2A.

Figure 3:
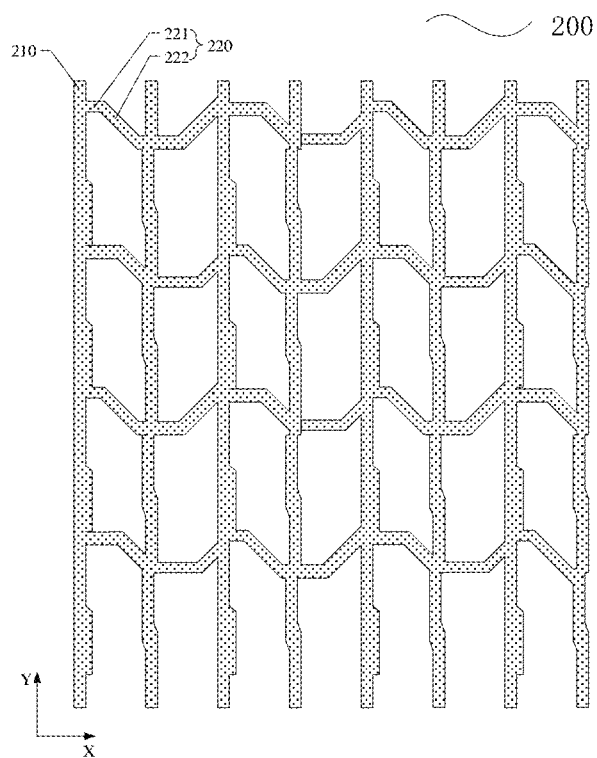
FIG. 3 is a planar structural view of a first metal signal line layer according to an embodiment of the present disclosure.
Figure 4:
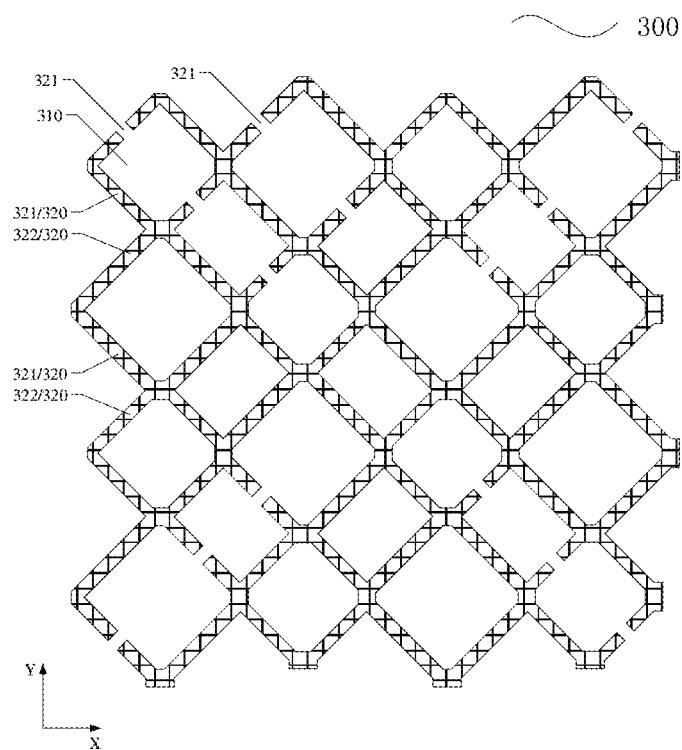
FIG. 4 is a planar structural view of a metal touch layer according to an embodiment of the present disclosure.
Figure 5:
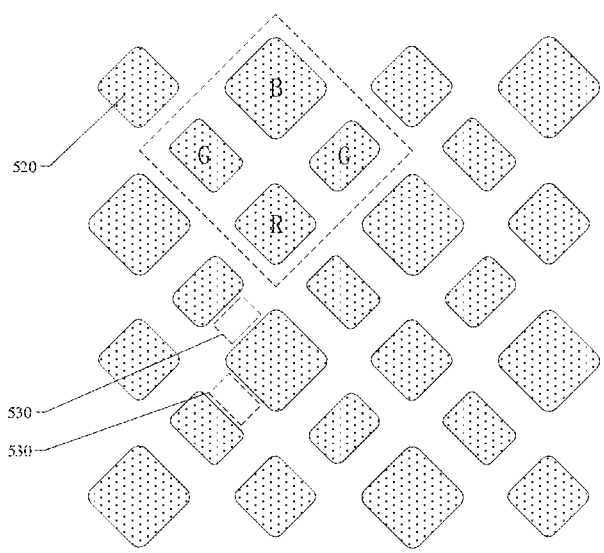
FIG. 5 is a planar structural view of a light emitting element according to an embodiment of the present disclosure.

As illustrated in FIG. 2A and FIG. 2B, the display substrate includes a base substrate 100, a first metal signal line layer 200 located on the base substrate 100 and having a first grid pattern, a metal touch layer 300 located at one side of the first metal signal line layer 200 away from the base substrate 100 and having a second grid pattern, and a light emitting element 520 located between the first metal signal line layer 200 and the metal touch layer 300. FIG. 2A illustratively shows the planar structure of the first metal signal line layer 200, the metal touch layer 300, and the light emitting element 520 of the display substrate and their positional relationship. As illustrated in FIG. 2A, in the direction perpendicular to the base substrate 100 (i.e., the direction perpendicular to the X-Y plane in the figure), the first metal signal line layer 200 and the metal touch layer 300 are overlapped with each other. FIGS. 3-5 show planar structures of the first metal signal line layer 200, the metal touch layer 300 and the light emitting element 520, respectively. FIG. 3 is a planar structural view of the first metal signal line layer 200, FIG. 4 is a planar structural view of the metal touch layer 300, and FIG. 5 is a planar structural view of the light emitting element 520.

For example, as illustrated in FIG. 2A and FIG. 3, the first metal signal line layer 200 includes a plurality of first metal signal lines 210 extending along the first direction Y, a plurality of metal connection signal lines 220 are included between every two adjacent first metal signal lines 210, and the plurality of metal connection signal lines 220 connect the two adjacent first metal signal lines 210, so that the plurality of first metal signal lines 210 and the plurality of metal connection signal lines 220 form the first grid pattern of the first metal signal line layer 200.

For example, as illustrated in FIG. 4, the metal touch layer 300 having the second grid pattern includes a plurality of grid lines 320 which are interconnected, and the plurality of grid lines 320 form a plurality of grids 310 arranged in an array. For example, as illustrated in FIG. 4, the grid lines 320 include a plurality of first grid lines 321 extending along a direction which forms an acute angle with the first direction Y, and a plurality of second grid lines 322 perpendicular to the plurality of first grid lines 321. The plurality of first grid lines 321 and the plurality of second grid lines 322 enclose a plurality of rectangular grids 310. For example, as illustrated in FIG. 4, the shapes and sizes of the plurality of rectangular grids 310 are not completely the same. Of course, FIG. 4 is only an example, and the embodiment of the present disclosure does not limit that the first grid lines 321 are perpendicular to the second grid lines 322. For example, the second grid lines 322 and the first grid lines 321 may only be intersected but not be perpendicular. In this case, the plurality of first grid lines 321 and the plurality of second grid lines 322 enclose a plurality of parallelogram grids 310.

For example, as illustrated in FIG. 2A, at least one part of the metal connection signal line 220 is parallel to the grid lines 320 of the metal touch layer 300, and the part of the metal connection signal line 220 parallel to the grid line 320 of the metal touch layer 300 is overlapped with the grid line 320 of the metal touch layer 300 in the direction perpendicular to the base substrate 100. For example, the parts, parallel to and corresponding to each other, of the metal connection signal line 220 and the metal touch line 300 can be completely overlapped or partially overlapped. For example, the parts, parallel to and corresponding to each other, of the metal connection signal line 220 and the grid line 320 of the metal touch layer 300 can be the same or different in width. For example, in the parts, parallel to and corresponding to each other, of the metal connection signal line 220 and the grid line 320 of the metal touch layer 300, the orthographic projection of a corresponding part of the metal connection signal line 220 on the base substrate can completely fall within the orthographic projection of a corresponding part of the grid line 320 of the metal touch layer 300 on the base substrate, or the orthographic projection of the corresponding part of the grid line 320 of the metal touch layer 300 on the base substrate can completely fall within the orthographic projection of the corresponding part of the metal connection signal line 220 on the base substrate. In this case, the shielding range of the grid lines of the metal touch layer and the metal connection signal lines can be minimized. In some examples, in the direction perpendicular to the extending direction of the parts, parallel to and corresponding to each other, of the metal connection signal line 220 and the grid line 320 of the metal touch layer 300, the corresponding part of the grid line 320 of the metal touch layer 300 and the corresponding part of the metal connection signal line 220 are staggered from each other but at least partially overlapped. In this case, the shielding range of the grid lines of the metal touch layer and the metal connection signal lines can also be reduced.

It should be noted that the at least one part of the metal connection signal line is parallel to the grid line of the metal touch layer, which is not limited to absolute parallel, and allows a certain error range. The part of the metal connection signal line parallel to the grid line of the metal touch layer is overlapped with the grid line of the metal touch layer, which means that the orthographic projection of the part of the metal connection signal line parallel to the grid line of the metal touch layer on the base substrate is at least partially overlapped with the orthographic projection of the grid line of the metal touch layer on the base substrate.

As described above, the grid line of the metal touch layer and the metal connection signal line are at least partially overlapped in the above manner, so that the shielding range of both of them can be reduced.

In some examples, in the region where the metal touch layer is provided (i.e., the touch region), the length of the part of the metal connection signal line 220 parallel to and overlapped with the grid line 320 of the metal touch layer accounts for more than 50% of the total length of the metal connection signal line 220.

For example, as illustrated in FIG. 2A, in the direction perpendicular to the base substrate 100, the first metal connection line segment 221 is at least partially overlapped with the grid line 320 located at the corner of the grid 310. For example, the first metal connection line segments are overlapped with the grid lines at the corners at a plurality of positions (one overlapping position is illustrated by the rectangular dashed frame C in the figure). For example, in one of the metal connection signal lines 220, the overlapping area between the first metal connection line segment 221 and the grid line 320 located at the corner of the grid 310 is smaller than the overlapping area between the second metal connection line segment 222 and the grid line 320 of the metal touch layer 300.

For example, as illustrated in FIG. 2A and FIG. 4, the grid line 320 of the metal touch layer includes a plurality of breakpoints 321, and in the direction perpendicular to the base substrate, the second metal connection line segment 222 is overlapped with at least part of the breakpoints 320. It should be noted that the breakpoints 320 not overlapped with the second metal connection line segment 222 can be seen from FIG. 2A, but the plurality of breakpoints 320 overlapped with the second metal connection line segment 222 cannot be seen. The reason why they are invisible is that the breakpoints 321 overlapped with the second metal connection line segment 222 is shielded by the second metal connection line segment 222.

For example, the base substrate 100 can be made of an inorganic material, such as a glass plate, a quartz plate, a metal plate, etc. For example, the material of the base substrate can also include an organic material, and the organic material can be a resin material, such as polyimide, polycarbonate, polyacrylate, polyetherimide, polyethersulfone, polyethylene terephthalate, polyethylene naphthalate, etc. The base substrate 100 can be a flexible base substrate or a non-flexible base substrate, without being limited in the embodiments of the present disclosure.

For example, the materials of the first metal signal line layer 200 and the metal touch layer 300 can include a metal material or an alloy material, and the first metal signal line layer 200 and the metal touch layer 300 can be a metal single layer or a multi-layer metal stack. For example, both the first metal signal line layer 200 and the metal touch layer 300 can be made of a three-layer metal stack including titanium, aluminum and titanium (Ti/Al/Ti).

FIG. 5 is a planar structural view of a light emitting element of a display substrate. For example, as illustrated in FIG. 2A, FIG. 2B and FIG. 5, the display substrate further includes a plurality of light emitting elements 520 arranged in an array, and in the direction perpendicular to the base substrate 100, the light emitting elements 520 are located between the metal touch layer 300 and the first metal signal line layer 200. A light transmission gap 530, which allows the reflected light 102 reflected from the display side (top in FIG. 2B) of the display substrate to pass through, is included between adjacent light emitting elements 520. It should be noted that the light transmission gap 530 does not necessarily refer to a light transmission slit, but can also be a light transmission region of the display substrate. For example, the grids 310 of the metal touch layer can be in one-to-one correspondence with the light emitting elements 520. The orthographic projection of each light emitting element 520 on the base substrate 100 falls within the orthographic projection of a corresponding grid 310 on the base substrate 100, and the area of the orthographic projection of the light emitting element 520 on the base substrate 100 is smaller than the area of the orthographic projection of the corresponding grid 310 on the base substrate 100. For example, as illustrated in FIG. 2A, the orthographic projection of the light emitting element 520 on the base substrate 100 and the orthographic projection of the corresponding grid 310 on the base substrate 100 jointly divide the light transmission gap 530 into a plurality of annular gaps.

Figure 2C:
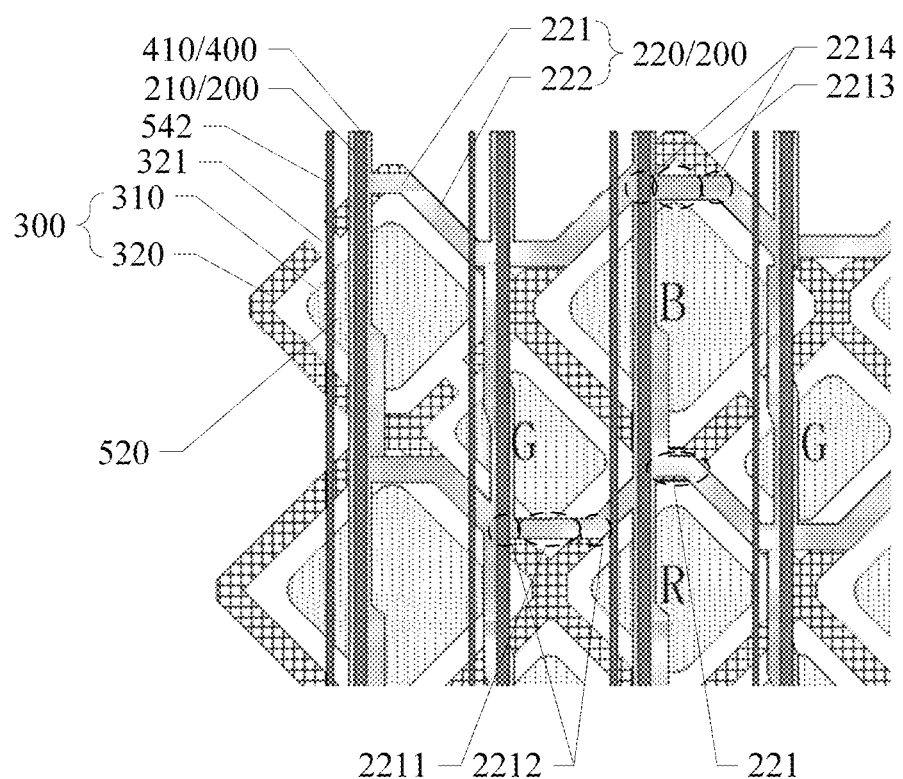
FIG. 2C is a partial enlarged view of the display substrate illustrated by a dashed frame D in FIG. 2A.

FIG. 2C is a partial enlarged view of the display substrate illustrated by a dashed frame D in FIG. 2A. For example, as illustrated in FIG. 2A, FIG. 2C and FIG. 5, the light emitting elements 520 include a red light emitting element R, a green light emitting element G and a blue light emitting element B. One red light emitting element R, two green light emitting elements G and one blue light emitting element B form a pixel unit (as illustrated by the dashed frame in FIG. 5). As illustrated in FIG. 2A, in the direction perpendicular to the base substrate, the first metal connection line segment 221 corresponding to the green light emitting element G is not completely overlapped with the grid line 320. For example, as illustrated in FIG. 2C, the middle part 2211 of the first metal connection line segment 221 corresponding to the green light emitting element G is not overlapped with the grid line 320, and both ends 2212 of the first metal connection line segment 221 corresponding to the green light emitting element G is overlapped with the grid line 320 at the corner. For example, as illustrated in FIG. 2C, the first metal connection line segment 221 corresponding to the red light emitting element R is completely overlapped with the grid line 320. For example, as illustrated in FIG. 2C, the middle part 2213 of the first metal connection line segment 221 corresponding to the blue light emitting element B is not overlapped with the grid line 320, and both ends 2214 of the first metal connection line segment 221 corresponding to the blue light emitting element B is overlapped with the grid line 320 at the corner.

It should be noted that the first metal connection line segment 221 corresponding to the green light emitting element G refers to the first metal connection line segment 221 located in the grid where the green light emitting element G is located. The first metal connection line segments 221 corresponding to the red light emitting element R and the blue light emitting element B refer to the first metal connection line segments 221 respectively located along the first direction Y and above the red light emitting element R and the blue light emitting element B in FIG. 2A. In addition, the positions of the green light emitting element G, the red light emitting element R and the blue light emitting element B can be interchanged, without being limited in the present disclosure.

For example, the display substrate provided by an embodiment of the present disclosure further includes a pixel defining layer 510. As illustrated in FIG. 2A, FIG. 2B and FIG. 5, the pixel defining layer 510 includes a plurality of openings 511 arranged in an array, and the openings 511 are in one-to-one correspondence with the light emitting elements 520, and at least a part of the light emitting element 520 is located in a corresponding opening 511. The light transmission gap 530 described above is located between adjacent openings 511.

It should be noted that although FIG. 2B illustratively shows that the light emitting element 520 is disposed in the opening of the pixel defining layer 510, the embodiments of the present disclosure are not limited to this case. For example, the light emitting element 520 can include an electroluminescent layer, and an anode and a cathode which are located at both sides of the electroluminescent layer. For example, the electroluminescent layer can be an organic light emitting layer. For example, the organic light emitting layer can be manufactured by means of evaporation or the like, the organic light emitting layer can be a continuous layer, and part of the organic light emitting layer located in the opening 511 is the effective light emitting region of the pixel unit. The light emitting element 520 described in the embodiments of the present disclosure may only include the organic light emitting layer located in the opening 511, that is, the light emitting element 520 may only include the effective light emitting region of the pixel unit. For another example, the anode for forming the light emitting element 520 may be further formed beyond the opening of the pixel defining layer 510. The specific structure of the light emitting element 520 will be further described with reference to FIG. 7.

For example, as illustrated in FIG. 2B, the pixel defining layer 510 is a layer with a certain light transmittance, and the pixel defining layer 510 between the light emitting elements 520 can allow the reflected light 102 to pass through. That is, the pixel defining layer 510 between the light emitting elements 520 can serve as the light transmission gap 530.

For example, the material of the pixel defining layer 510 can include an organic insulating material, such as polyimide, phthalimide, phthalamide, acrylic resin, benzocyclobutene or phenolic resin, etc., or include an inorganic insulating material, such as silicon oxide, silicon nitride, etc., without being limited in the embodiments of the present disclosure.

In the display substrate provided by one embodiment of the present disclosure, at least one part of the metal connection signal lines are parallel to and overlapped with the grid lines of the metal touch layer, which can reduce the shielding area of the metal connection signal lines and the metal touch layer on the light transmission gap of the display substrate, thereby improving the sensitivity of under-screen fingerprint detection of the display device adopting the display substrate and realizing large-area under-screen fingerprint identification. In addition, the grid lines of the metal touch layer are at least partially overlapped with the metal connection signal lines, so that the area for setting opaque lines can also be reduced, thereby increasing the pixel aperture ratio of the display substrate.

For example, as illustrated in FIG. 2A, the light emitting element 520 is rectangular, and the grid 310 is also rectangular. Of course, the shapes of the light emitting element 520 and the grid 310 are not limited to rectangles. For example, although the shapes and sizes of the light emitting elements illustrated in FIG. 2A and FIG. 5 are all the same, the embodiments of the present disclosure are not limited thereto. According to actual needs, the shapes and sizes of different light emitting elements 520 may not be completely the same, and the shapes and sizes of corresponding grids 310 may not be completely the same.

Figure 6:
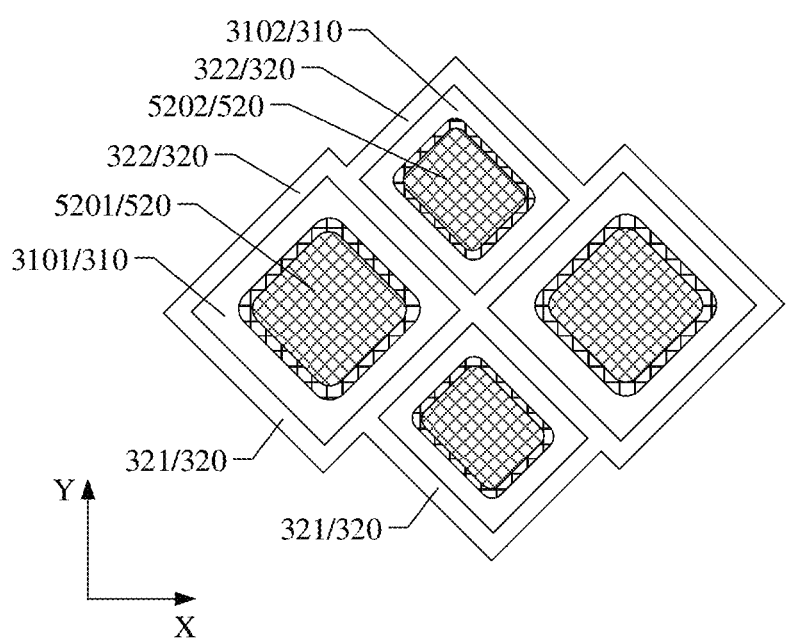
FIG. 6 is a partial planar structure view of a display substrate according to an embodiment of the present disclosure.

FIG. 6 is a partial planar structure view of a display substrate, illustratively showing the structures of the light emitting element 520 and the grid 310 of the metal touch layer. For example, as illustrated in FIG. 6, the light emitting element 520 of the display substrate is a rectangular light emitting element, including a first light emitting element 5201 and a second light emitting element 5202 which have different sizes. The grid 310 of the touch metal layer 300 is a rectangular grid, including a first grid 3101 and a second grid 3102 which have different sizes. The first light emitting element 5201 corresponds to the first grid 3101, and the second light emitting element 5202 corresponds to the second grid 3102. For example, the area of the first light emitting element 5201 is larger than the area of the second light emitting element 5202, and correspondingly, the area of the first grid 3101 is also larger than the area of the second grid 3102. In this way, it is possible to keep as large a transparent area around each pixel as possible and ensure the sensitivity of fingerprint detection.

For example, the display substrate includes a pixel driving circuit used for driving the light emitting element 520. The first metal signal line 210 is a power line of the pixel driving circuit and is configured to provide a power signal to the pixel driving circuit, and the power signal is a high-voltage power signal (VDD signal), a low-voltage power signal (VSS signal) or a current power signal. The plurality of first metal signal lines 210 and the plurality of metal connection signal lines 220 form the first grid pattern of the first metal signal line layer 200, which can ensure the uniformity of voltage or current signals of the display substrate in a second direction X perpendicular to the first direction Y, thereby improving display quality of the picture.

In some examples, as illustrated in FIG. 2A and FIG. 2B, the display substrate provided by an embodiment of the present disclosure further includes a second metal signal line layer 400, which is located at one side of the first metal signal line layer 200 close to the base substrate 100. A first planarization layer 570 is included between the second metal signal line layer 400 and the first metal signal line layer 200, and a plurality of via holes 610 are formed in the first planarization layer 570. The second metal signal line layer 400 includes a plurality of second metal signal lines 410 extending along the first direction Y, the second metal signal lines 410 are in one-to-one correspondence with the first metal signal lines 210 and the second metal signal lines 410 are overlapped with the first metal signal lines 210 in the direction perpendicular to the base substrate, and each second metal signal line 410 is electrically connected with a corresponding first metal signal line 210 through a via hole 610. The second metal signal line 410 is also a power line of the pixel driving circuit, for example, a positive power line (VDD power line), and is configured to provide a power signal to the light emitting element 520.

For example, the material of the second metal signal line layer 400 can include a metal material or an alloy material, and the second metal signal line layer 400 can be a metal single layer or a multi-layer metal stack. For example, both the first metal signal line layer 200 and the metal touch layer 300 can be made of a three-layer metal stack including titanium, aluminum and titanium (Ti/Al/Ti).

In the display substrate provided by one embodiment of the present disclosure, the second metal signal lines are electrically connected with the first metal signal lines in one-to-one correspondence. In this way, the first metal signal line 210 and the second metal signal line 410 adopt a double-layer parallel metal routing mode (for example, as the positive pole of the power supply of the pixel driving circuit), which can reduce the resistance and ensure the signal uniformity of the display substrate in the first direction Y, thus improving display quality of the picture.

It should be noted that although FIG. 2A shows that the width of the second metal signal line 410 in the second direction X is less than the width of the first metal signal line 210 in the second direction X, it is not limited to this case. For example, the width of the second metal signal line 410 in the second direction X is equal to the width of the first metal signal line 210 in the second direction X, and in this case, the orthographic projection of the second metal signal line 410 on the base substrate 100 basically coincides with the orthographic projection of the first metal signal line 210 on the base substrate 100. In another example, the width of the second metal signal line 410 in the second direction X is greater than the width of the first metal signal line 210 in the second direction X. For another example, the width of the second metal signal line 410 or the first metal signal line 210 varies at different positions in the second direction X. At some positions, the width of the second metal signal line 410 is greater than the width of the first metal signal line 210, while at some other positions, the width of the second metal signal line 410 is less than or equal to the width of the first metal signal line 210.

For example, as illustrated in FIG. 2A and FIG. 3, the metal connection signal line 220 is a fold line, which includes a first metal connection line segment 221 and a second metal connection line segment 222 connected with each other. The first metal connection line segment 221 extends along a second direction X perpendicular to the first direction Y, and the second metal connection line segment 222 extends along a direction which forms an acute angle or obtuse angle with the first direction Y.

For example, as illustrated in FIG. 2A, the second metal connection line segment 222 is parallel to a grid line 320 of the metal touch layer 300, and the second metal connection line segment 222 is overlapped with the metal touch layer 300 in the direction perpendicular to the base substrate 100. It should be noted that although FIG. 2A shows that the width of the second metal connection line segment 222 is equal to the width of the grid line 320 of the metal touch layer 300, it is not limited to this case. For example, the width of the second metal connection line segment 222 can also be less or greater than the width of the grid line 320 of the metal touch layer 300. For example, the width of the second metal connection line segment 222 is less than or equal to the width of the grid line 320 of the metal touch layer 300, and the orthographic projection of the second metal connection line segment 222 on the base substrate 100 falls within the orthographic projection of the metal touch layer 300 on the base substrate 100.

In the display substrate provided by one embodiment of the present disclosure, the second metal connection line segment is parallel to and overlapped with the grid line of the metal touch layer, which can reduce the shielding area of the second metal connection line segment on the light transmission gap of the display substrate, thereby improving the sensitivity of under-screen fingerprint detection of a display device adopting the display substrate and realizing large-area under-screen fingerprint identification.

For example, as illustrated in FIG. 2A and FIG. 3, the length of the second metal connection line segment 222 is greater than or equal to the length of the first metal connection line segment 221. That is, the part of the second metal connection line 220 overlapped with the metal touch layer is larger than the part of the second metal connection line 220 not overlapped with the metal touch layer; or in the direction perpendicular to the base substrate 100, the overlapping area between the second metal connection line segment 222 and the grid line 320 of the metal touch layer is greater than 50% of the area of the metal connection signal line 220. In this way, it is beneficial to reducing the shielding area of the second metal connection line on the light transmission gap of the display substrate, thereby improving the sensitivity of under-screen fingerprint detection of a display device adopting the display substrate and realizing large-area under-screen fingerprint identification.

For example, as illustrated in FIG. 2A and FIG. 3, the metal connection signal line 220 is not overlapped with the light emitting element 520, which is beneficial to improving the pixel aperture ratio of the display substrate.

For example, FIG. 2B also illustratively shows the structures of a light emitting element 520 and a switching element 540. For example, as illustrated in FIG. 2B, the display substrate provided by an embodiment of the present disclosure further includes at least one switching element 540, and each light emitting element 520 has a corresponding switching element 540 to control the light emitting element 520 to be turned on or off. In addition, it should be noted that the pixel circuit controlling each light emitting element 520 can include a plurality of switching elements, and for simplicity, only one of the switching elements is illustratively illustrated in FIG. 2B.

For example, as illustrated in FIG. 2B, the switching element 540 is a thin film transistor 540. The thin film transistor 540 includes an active layer 543 on the substrate 100, a gate electrode 544 located at one side of the active layer 543 away from the base substrate 100, and a source electrode 541 and a drain electrode 541 located at one side of the gate electrode 544 away from the base substrate.

For example, as illustrated in FIG. 2B, the display substrate provided by the embodiment of the present disclosure further includes a connection electrode 580. The connection electrode is located between the thin film transistor and the light emitting element, and is electrically connected with the drain electrode of the thin film transistor and the light emitting element, respectively.

For example, the first metal signal line layer 200 is disposed in the same layer as the connection electrode 580, and the second metal signal line layer 400 is disposed in the same layer as the source electrode or the drain electrode.

The light emitting element 520 is located at one side of the thin film transistor 540 away from the base substrate 100. Each light emitting element 520 also includes an anode 522, an electroluminescent layer 521 and a cathode 523, which are laminated in the direction perpendicular to the base substrate. The electroluminescent layer 521 is located between the anode 522 and the cathode 523, and can emit light under the joint action of the anode and the cathode. For example, the anodes 522 of the light emitting elements are insulated from each other. The cathodes 523 of the light emitting elements are connected to each other, so as to form a continuous cathode layer. For example, the anode 522 can serve as a pixel electrode, so that the brightness of each light emitting element can be independently controlled for display.

For example, as illustrated in FIG. 2B, the active layer of the thin film transistor 540 includes a source region and a drain region, and a channel region located between the source region and the drain region. The thin film transistor 540 includes source and drain electrode 541, which are respectively electrically connected with the source region and the drain region through via holes. The gate electrode is overlapped with the channel region between the source region and the drain region in the active layer in the direction perpendicular to the base substrate 100.

For example, as illustrated in FIG. 2A, the display substrate further includes a plurality of data lines 542 extending along the first direction Y. The data line 542 is configured to provide a data signal to the pixel driving circuit. For example, different from the double-layer parallel routing structure formed of the first metal signal line 210 and the second metal signal line 410, the data line 542 adopts a single-layer metal routing structure.

For example, the data line 542 is arranged in the same layer as the second metal signal line 410, and the data line 542 is parallel to and insulated from the second metal signal line 410. For example, the width of the data line 542 is less than the width of the second metal signal line 410.

For example, the materials of the data line 542 and the source and drain electrodes 541 can include a metal material or an alloy materials, and the data line 542 and the source and drain electrodes 541 can be a metal single layer or a multi-layer metal stack, for example, made of a three-layer metal stack including titanium, aluminum and titanium (Ti/Al/Ti). The data line 542 and the source and drain electrodes 541 are arranged in the same layer as the second metal signal line 410, and they can be manufactured by the same patterning process, thereby simplifying the manufacturing process of the display substrate and saving the manufacturing cost.

For example, as illustrated in FIG. 2B, the display substrate further includes a first planarization layer 570, and the first planarization layer 570 is located above the source electrode and drain electrode 541 and is configured to planarize the surface of the thin film transistor on the side away from the base substrate. A connection electrode 580 is formed on the first planarization layer 570, and the connection electrode 580 is overlapped with the anode 522 in the direction perpendicular to the base substrate. The display substrate further includes a second planarization layer 590, the second planarization layer 590 is located between the anode 522 and the connection electrode 580, and is configured to planarize the surface of the connection electrode 580 on the side away from the base substrate. The connection electrode 580 is electrically connected with the source and drain electrodes 541 through via holes, and the anode 522 is electrically connected with the connection electrode 580 through a via hole, thereby realizing the electrical connection between the anode 522 and the source and drain electrodes 541. The connection electrode can avoid directly forming a through-hole with a large aperture in the first planarization layer and the second planarization layer, thus improving the quality of the electrical connection using a via hole.

For example, the connection electrode 580 is located in the first metal signal line layer 200, that is, the connection electrode 580 is arranged in the same layer as the first metal signal line 210 and the metal connection signal line 220. Therefore, the connection electrode, the first metal signal line and the metal connection signal line can be manufactured by the same patterning process, thereby simplifying the manufacturing process of the display substrate and saving the manufacturing cost.

For example, as illustrated in FIG. 2B, the display substrate further includes a first buffer layer 110 located between the base substrate 100 and the active layer 543. The display substrate further includes a passivation layer 620 between the first planarization layer 570 and the source electrode and drain electrode 541. The display substrate further includes a second buffer layer 740 on a second inorganic encapsulation layer 730.

For example, the anode 522 can include a reflective layer, and the cathode 523 can include a transparent layer or a translucent layer. For example, the area of the anode 522 is larger than the area of the electroluminescent layer 521 located in the opening 511, and the light transmission gap 530 between adjacent light emitting elements 520 can further refer to the gap between adjacent anodes 522. Therefore, the anode 522 can reflect the light emitted by the electroluminescent layer 521 in the light emitting element 520, and this part of light is emitted to the external environment through the cathode 523, so that the light exiting rate can be improved. At the same time, the anode 522 includes a reflective layer, so that the light emitting element can be prevented from emitting light downward, which may otherwise enters the fingerprint sensor together with the fingerprint reflected light, interferes with fingerprint detection and affects the sensitivity and accuracy of fingerprint detection.

It should be noted that the size of the light emitting element described above can refer to the size of the anode of each light emitting element. Generally, the size of the anode is greater than the size of the effective light emitting region of the light emitting element, and the region around the anode of the light emitting element can be set as a light transmission gap for the light used for fingerprint detection to pass through.

For example, the material of the anode 522 can include at least one transparent conductive oxide material, including indium tin oxide (ITO), indium zinc oxide (IZO), zinc oxide (ZnO), etc. In addition, the anode 522 can include a metal having high reflectivity as a reflective layer, such as silver (Ag).

For example, for OLED, the material of the electroluminescent layer 521 can include a small molecular organic material or a polymer molecular organic material, can be a fluorescent luminescent material or a phosphorescent luminescent material, and can emit red light, green light, blue light or white light; Furthermore, the electroluminescent layer can further include functional layers, such as an electron injection layer, an electron transport layer, a hole injection layer, a hole transport layer, etc., as needed.

For example, the cathode 523 can include one of various conductive materials. For example, the cathode 523 can include a metal material, such as lithium (Li), aluminum (Al), magnesium (Mg), silver (Ag), etc.

For example, as illustrated in FIG. 2B, the display substrate further includes an encapsulation layer 700 covering the light emitting element 520. The metal touch layer 300 is located at one side of the encapsulation layer 700 away from the base substrate 100. The encapsulation layer 700 seals the light emitting element 520, so that deterioration of the light emitting element 520 caused by moisture or oxygen included in the environment can be reduced or prevented. The encapsulation layer 700 can have a single layer structure or a composite layer structure, and the composite layer structure includes a stacked structure of inorganic layers and organic layers. For example, as illustrated in FIG. 2B, the encapsulation layer 700 includes a first inorganic encapsulation layer 710, an organic encapsulation layer 720, and a second inorganic encapsulation layer 730 which are sequentially arranged.

For example, the material of the encapsulation layer can include an insulating material, such as silicon nitride, silicon oxide, silicon oxynitride, and polymer resin, etc. Inorganic materials, such as silicon nitride, silicon oxide and silicon oxynitride, etc., have high compactness and can prevent the invasion of water and oxygen; the material of the organic encapsulation layer can be a polymer material containing desiccant or a polymer material capable of blocking water vapor, etc. For example, polymer resin and the like can planarize the surface of the display substrate, can relieve the stress of the first inorganic encapsulation layer and the second inorganic encapsulation layer, and can also include water-absorbing materials such as desiccant, etc., to absorb water, oxygen and other substances invading inside.

For example, as illustrated in FIG. 2B, the display substrate further includes a second buffer layer 740 located at one side of the second inorganic encapsulation layer 730 away from the base substrate 100. For example, the display substrate further includes an insulating layer 750 located at one side of the second buffer layer 740 away from the base substrate 100. For example, the insulating layer 750 can be a silicon nitride layer.

For example, the display substrate provided by the embodiments of the present disclosure has a touch function, which is realized by the metal touch layer 300. The touch structure used for realizing the touch function can be of self-capacitance type or mutual capacitance type. The self-capacitance type touch structure includes a plurality of self-capacitance electrodes arranged in an array (in the same layer), and each self-capacitance electrode is electrically connected with a touch processing circuit (touch chip) through a touch lead. The position detection is realized by detecting the capacitance change of the self-capacitance electrode because of, for example, the approaching of a finger when touching. The mutual capacitance touch structure includes a plurality of first touch signal lines extending along a first direction and a plurality of second touch signal lines extending along a second direction, and the first touch signal lines and the second touch signal lines are electrically connected with a touch processing circuit (touch chip) through touch leads. The first direction and the second direction are intersected with each other and form an opening, so that a touch capacitance is formed at the intersection position of the first touch signal line and the second touch signal line, and position detection is realized by detecting the change of the touch capacitance caused by, for example, the approaching of a finger when touching. The embodiments of the present disclosure are described by taking a mutual capacitance touch structure as an example.

The metal touch layer 300 includes a touch electrode bridging layer, a touch electrode insulating layer and a touch electrode layer which are laminated. The touch electrode layer includes a plurality of driving electrodes and a plurality of sensing electrodes which are insulated from each other. The second grid pattern of the metal touch layer is located in the touch electrode layer, and the plurality of metal grids in the second grid pattern form a driving electrode or a sensing electrode, and the plurality of driving electrodes are connected to form a driving electrode line, and the plurality of sensing electrodes are connected to form a sensing electrode line. The touch electrode insulating layer is located between the touch electrode bridging layer and the touch electrode layer, and includes a plurality of via holes. The plurality of via holes electrically connect the touch electrode bridging layer and the touch electrode layer, so as to play the role of bridging the driving electrode or the sensing electrode in the touch electrode layer.

For example, as illustrated in FIG. 2B, the metal touch layer 300 is located on the encapsulation layer 700. By directly forming the touch structure on the encapsulation layer, for example, by directly manufacturing a metal touch grid on the second inorganic encapsulation layer 730, it is beneficial to improving the integration of the display substrate, thereby reducing the thickness of the display substrate and improving the folding performance of the display substrate.

For example, as illustrated in FIG. 2B, the display substrate further includes a cover plate 800. The cover plate 800 is, for example, a base substrate or film layer made of glass or plastic, which is used to support and protect the display substrate, and can also be used for the user to perform touch operation thereon.

An embodiment of the present disclosure provides a display device, which includes the display substrate 10 provided by any one of the above embodiments.

Figure 7:
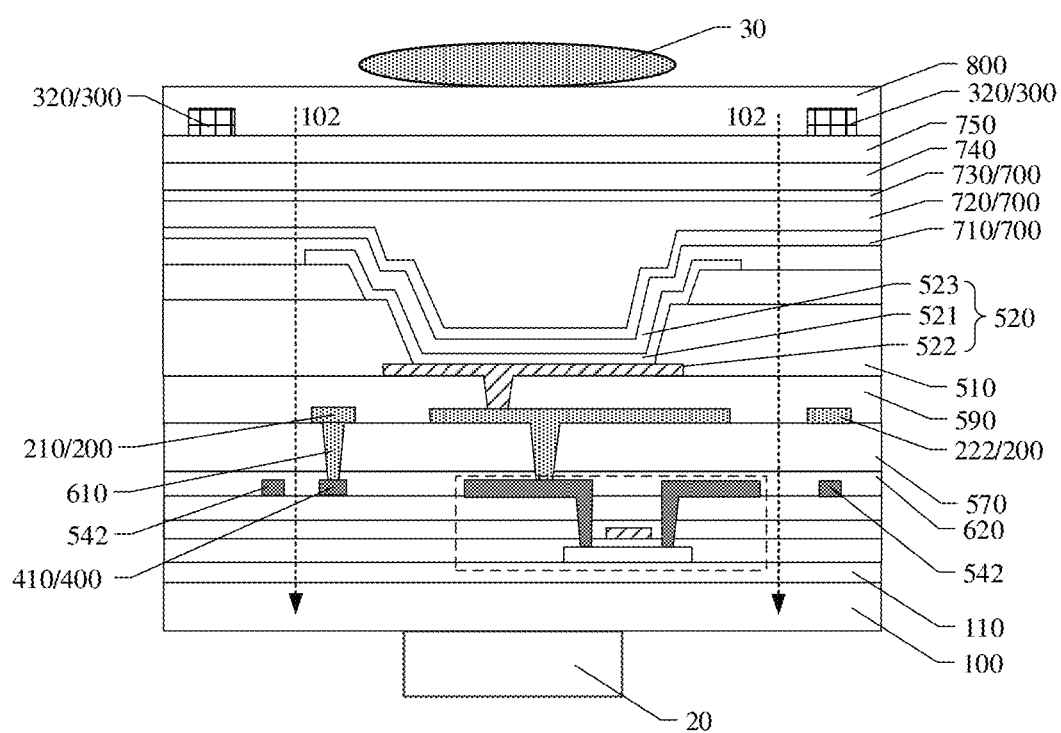
FIG. 7 is a cross-sectional structural view of a display device according to an embodiment of the present disclosure.

FIG. 7 is a cross-sectional structural view of a display device according to an embodiment of the present disclosure. In some examples, as illustrated in FIG. 7, the display device further includes a fingerprint sensor 20, located at one side of the base substrate 100 away from the first metal signal line layer 200 and configured to detect the fingerprint 30 on the display substrate 10. For example, the fingerprint sensor 20 is attached to one side of the base substrate 100 away from the first metal signal line layer 200 (i.e., the lower side in the figure) via optical clear adhesive (OCA), and is used for detecting the reflected light 102 reflected from the surface of the cover plate 800 for fingerprint detection. The fingerprint sensor 20 has a certain area, and includes regions corresponding to a plurality of light emitting elements. The fingerprint sensor 20 is coupled with a fingerprint detection processor (e.g., an integrated circuit chip) through a lead, so that the acquired fingerprint image can be transmitted to the fingerprint detection processor in the form of a data signal. The fingerprint sensor 20 can be any one of suitable types of fingerprint sensors, such as a charge coupled device (CCD) type or a complementary metal oxide semiconductor (CMOS) type image sensor, etc.

For example, the display device provided by the embodiments of the present disclosure can be any product or component having display function, such as a mobile phone, a tablet computer, a television, a display, a notebook computer, a digital photo frame, a navigator, etc.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

What is claimed is:
1. A display substrate, comprising:
a base substrate;
a first metal signal line layer, located on the base substrate and comprising a plurality of first metal signal lines extending along a first direction, a plurality of metal connection signal lines being comprised between every two adjacent first metal signal lines, and the plurality of metal connection signal lines connecting the two adjacent first metal signal lines;
a metal touch layer, located at a side of the first metal signal line layer away from the base substrate and comprising a plurality of grid lines which are intersected, the plurality of grid lines forming a plurality of grids arranged in an array,
wherein at least a part of each of the plurality of metal connection signal lines is parallel to the plurality of grid lines of the metal touch layer, and in a direction perpendicular to the base substrate, the part of each of the plurality of metal connection signal lines parallel to the plurality of grid lines of the metal touch layer is at least partially overlapped with the plurality of grid lines of the metal touch layer;
each of the plurality of metal connection signal lines is a fold line comprising a first metal connection line segment and a second metal connection line segment connected with each other;
the second metal connection line segment is parallel to the grid lines of the metal touch layer, and in the direction perpendicular to the base substrate, the second metal connection line segment is overlapped with the grid lines of the metal touch layer; and
in the direction perpendicular to the base substrate, an overlapping area between the second metal connection line segment of the metal connection signal line and the grid lines is greater than 50% of an area of the metal connection signal line.

2. The display substrate according to claim 1, wherein the first metal connection line segment extends along a second direction which is perpendicular to the first direction, and the second metal connection line segment extends along a direction which forms an acute angle or obtuse angle with the first direction.

3. The display substrate according to claim 1, wherein, in the direction perpendicular to the base substrate, the first metal connection line segments of a part of the metal connection signal lines are at least partially overlapped with a part of the grid lines located at corners of the grids.

4. The display substrate according to claim 3, wherein, in one of the metal connection signal lines, an overlapping area between the first metal connection line segment and the grid line located at the corner of the grid is smaller than an overlapping area between the second metal connection line segment and the grid line of the metal touch layer.

5. The display substrate according to claim 1, wherein the grid lines comprise a plurality of breakpoints, and in the direction perpendicular to the base substrate, the second metal connection line segments are overlapped with at least part of the breakpoints.

6. The display substrate according to claim 1, wherein a length of the second metal connection line segment is greater than a length of the first metal connection line segment.

7. The display substrate according to claim 1, further comprising a plurality of light emitting elements arranged in an array, a light transmission gap being comprised between adjacent light emitting elements, and in the direction perpendicular to the base substrate, the plurality of light emitting elements being located between the metal touch layer and the first metal signal line layer,
wherein the plurality of grids are in one-to-one correspondence with the plurality of light emitting elements, an orthographic projection of each light emitting element on the base substrate falls within an orthographic projection of a corresponding grid on the base substrate, and an area of the orthographic projection of each light emitting element on the base substrate is smaller than an area of the orthographic projection of the corresponding grid on the base substrate.

8. The display substrate according to claim 7, wherein the plurality of light emitting elements comprise a red light emitting element, a green light emitting element and a blue light emitting element, and in the direction perpendicular to the base substrate, a middle part of the first metal connection line segment corresponding to the green light emitting element is not overlapped with the grid line, and two ends of the first metal connection line segment corresponding to the green light emitting element is overlapped with the grid line;

the first metal connection line segment corresponding to the red light emitting element is completely overlapped with the grid line;

a middle part of the first metal connection line segment corresponding to the blue light emitting element is not overlapped with the grid line, and two ends of the first metal connection line segment corresponding to the blue light emitting element is overlapped with the grid line.

9. The display substrate according to claim 1, further comprising a second metal signal line layer, located at a side of the first metal signal line layer close to the base substrate, wherein the second metal signal line layer comprises a plurality of second metal signal lines extending along the first direction, and the plurality of second metal signal lines are electrically connected with the plurality of first metal signal lines.

10. The display substrate according to claim 7, wherein, in the direction perpendicular to the base substrate, the plurality of metal connection signal lines are not overlapped with the plurality of light emitting elements.

11. The display substrate according to claim 7, further comprising:

a pixel defining layer, comprising a plurality of openings arranged in an array; and an encapsulation layer, covering the light emitting element, wherein the plurality of openings are in one-to-one correspondence with the plurality of light emitting elements, and the plurality of openings of the pixel defining layer define effective light emitting regions of the plurality of light emitting elements, the metal touch layer is located at a side of the encapsulation layer away from the base substrate.

12. The display substrate according to claim 1, further comprising a data line, located in a same layer as the second metal signal line layer, parallel to and insulated from the plurality of second metal signal lines.

13. The display substrate according to claim 1, wherein the metal touch layer comprises a touch electrode bridging layer, an insulating layer and a touch electrode layer which are laminated, the insulating layer is located between the touch electrode bridging layer and the touch electrode layer, and the insulating layer comprises a via hole connecting the touch electrode bridging layer and the touch electrode layer.

14. The display substrate according to claim 1, wherein the plurality of first metal signal lines are positive power lines.

15. The display substrate according to claim 9, further comprising at least one thin film transistor and a connection electrode, located between the base substrate and the light emitting element, the at least one thin film transistor comprises an active layer on the base substrate, a gate electrode located at a side of the active layer away from the base substrate, and a source electrode and a drain electrode located at a side of the gate electrode away from the base substrate;

the connection electrode is located between the at least one thin film transistor and the light emitting element, and is electrically connected with the drain electrode of the thin film transistor and the light emitting element;

the first metal signal line layer and the connection electrode are arranged in a same layer, and the second metal signal line layer and the source electrode are arranged in a same layer.

16. The display substrate according to claim 1, wherein the base substrate is a flexible base substrate.

17. A display device, comprising:

the display substrate according to claim 1; and a fingerprint sensor, located at a side of the base substrate away from the first metal signal line layer and configured to detect a fingerprint on the display substrate.

* * * * *